(12) United States Patent  
Kim

(10) Patent No.: US 10,197,634 B2  
(45) Date of Patent: Feb. 5, 2019

(54) IDENTIFICATION CODE ALLOCATING DEVICE FOR BATTERY MANAGEMENT CATEGORIES, SEQUENCING DEVICE FOR BATTERY MANAGEMENT CATEGORIES, AND BATTERY MANAGEMENT METHOD USING SAME

(71) Applicant: LG CHEM, LTD., Seoul (KR)

(72) Inventor: Hahnsang Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 38 days.

(21) Appl. No.: 15/501,707

(22) PCT Filed: Aug. 10, 2015

(86) PCT No.: PCT/KR2015/008355  
§ 371 (c)(1),  
(2) Date: Feb. 3, 2017

(87) PCT Pub. No.: WO2016/060368  
PCT Pub. Date: Apr. 21, 2016

(65) Prior Publication Data  
US 2017/0219656 A1 Aug. 3, 2017

(30) Foreign Application Priority Data  
Oct. 17, 2014 (KR) .................. 10-2014-0140557

(51) Int. Cl.  
*G01R 31/36* (2006.01)  
*H01M 10/48* (2006.01)  
*H01M 10/42* (2006.01)

(52) U.S. Cl.  
CPC ......... *G01R 31/3651* (2013.01); *G01R 31/36* (2013.01); *G01R 31/3679* (2013.01); *H01M 10/4221* (2013.01); *H01M 10/486* (2013.01)

(58) Field of Classification Search  
CPC ............... G01R 31/005; G01R 31/008; G01R 31/3275; G01R 31/42  
(Continued)

(56) References Cited

U.S. PATENT DOCUMENTS 8,901,888 B1 * 12/2014 Beckman ............ H01M 2/1022  
320/125  
2004/0036475 A1 2/2004 Pascoe et al.  
(Continued)

FOREIGN PATENT DOCUMENTS

EP 2720348 A2 4/2014  
JP 9-119933 A 5/1997  
(Continued)

OTHER PUBLICATIONS

International Search Report for PCT/KR2015/008355 (PCT/ISA/210) dated Dec. 23, 2015.  
(Continued)

*Primary Examiner* — John H Le  
(74) *Attorney, Agent, or Firm* — Birch, Stewart, Kolasch & Birch, LLP

(57) ABSTRACT

The preset invention relates to an identification code allocating device for battery management categories, a sequencing device for the battery management categories, and a battery management method using the same and the identification code allocating device includes: a unique identification code allocating unit allocating a unique identification code for a plurality of battery management categories each; a cycle identification code allocating unit allocating a cycle identification code for each of the plurality of battery management categories to correspond to a cycle of each of the plurality of battery management categories; and a dependency identification code allocating unit allocating a dependency identification code for each of the plurality of battery (Continued)

management categories to correspond to dependency relationships among the plurality of battery management categories.

18 Claims, 4 Drawing Sheets

(58) Field of Classification Search
 USPC .................. 702/63; 307/9.1, 150; 320/125; 324/425
 See application file for complete search history.

(56) References Cited

U.S. PATENT DOCUMENTS

| | | | |
|---|---|---|---|
| 2013/0318127 A1 | 11/2013 | West et al. | |
| 2014/0292072 A1* | 10/2014 | Nakanishi | B60L 11/1851 307/9.1 |

FOREIGN PATENT DOCUMENTS

| | | |
|---|---|---|
| JP | 2001-142999 A | 5/2001 |
| KR | 10-2014-0039136 A | 4/2014 |
| KR | 10-1384847 B1 | 4/2014 |
| WO | WO 2013/165597 A1 | 11/2013 |

OTHER PUBLICATIONS

Written Opinion of the International Searching Authority for PCT/KR2015/008355 (PCT/ISA/237) dated Dec. 23, 2015.
Extended European Search Report, dated Apr. 12, 2018, for European Application No. 15850348.2.

* cited by examiner

[Figure 1]
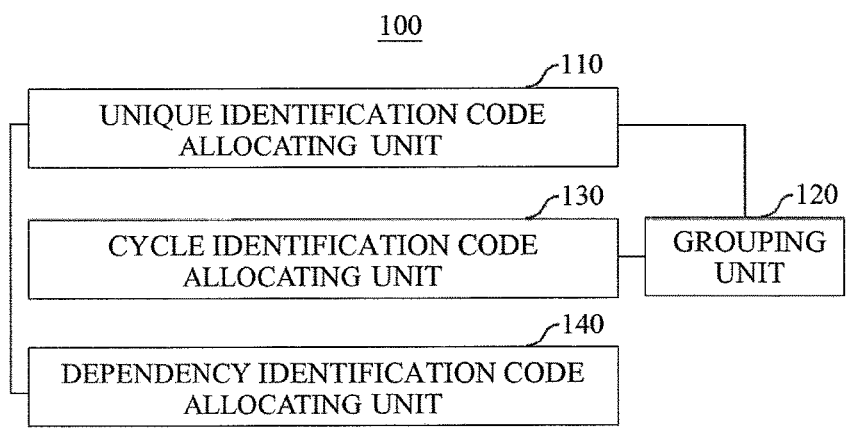
[Figure 2]
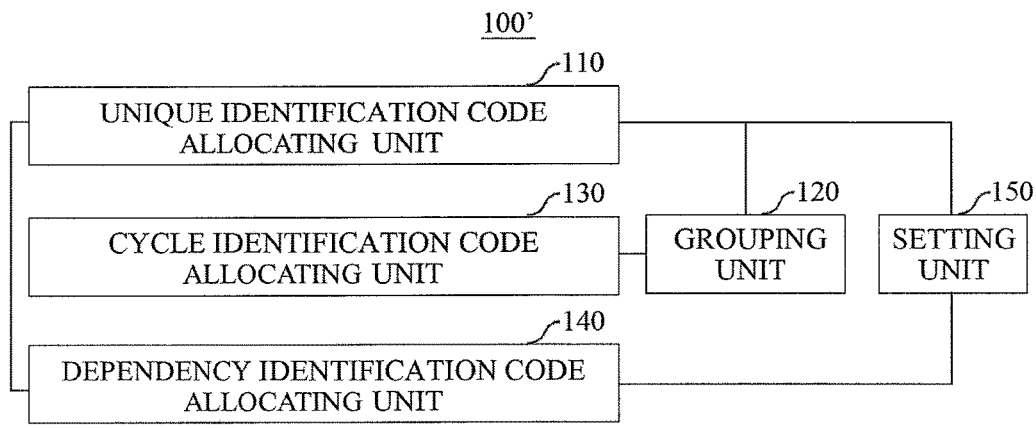

[Figure 3]
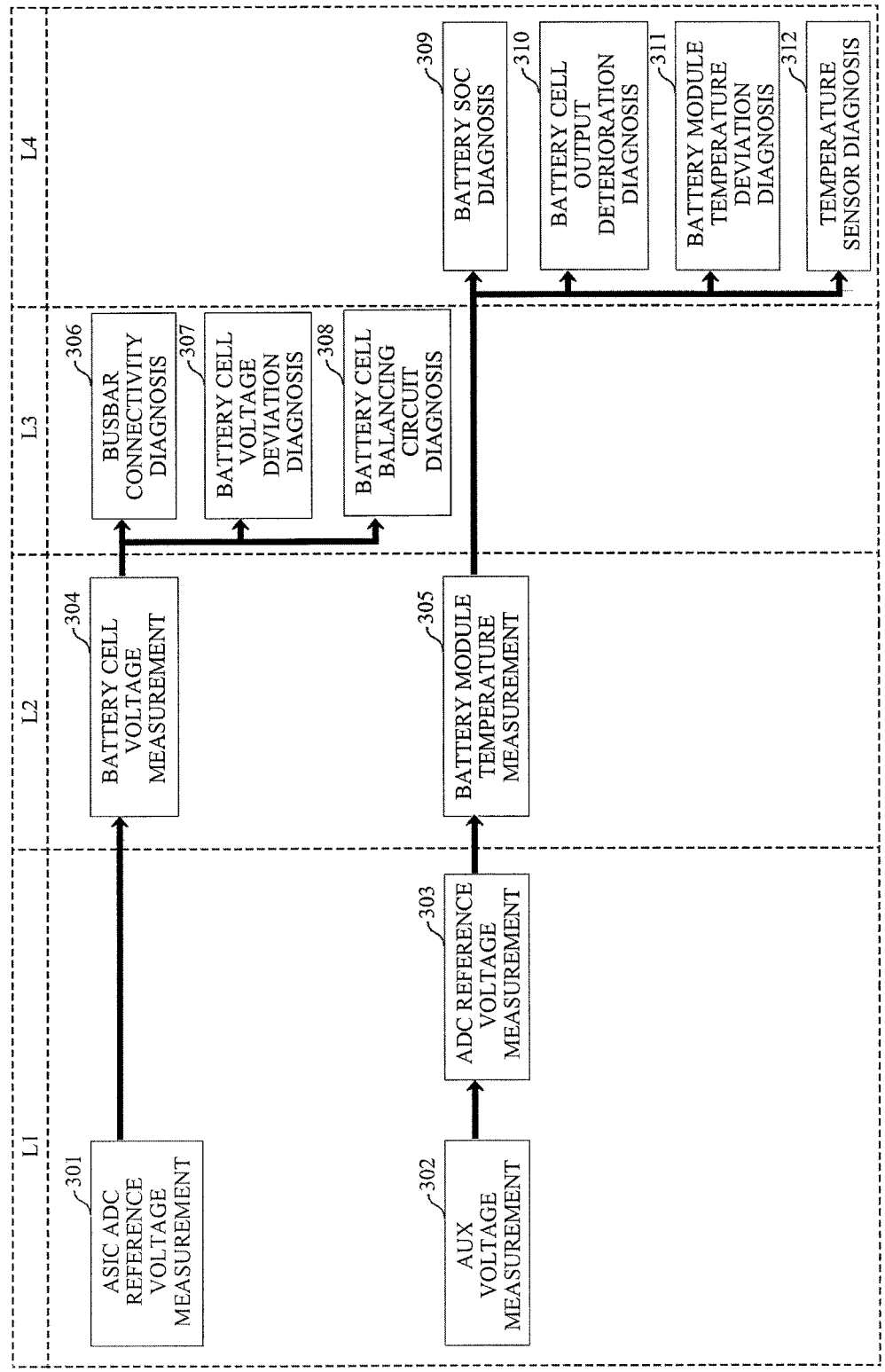

[Figure 4]
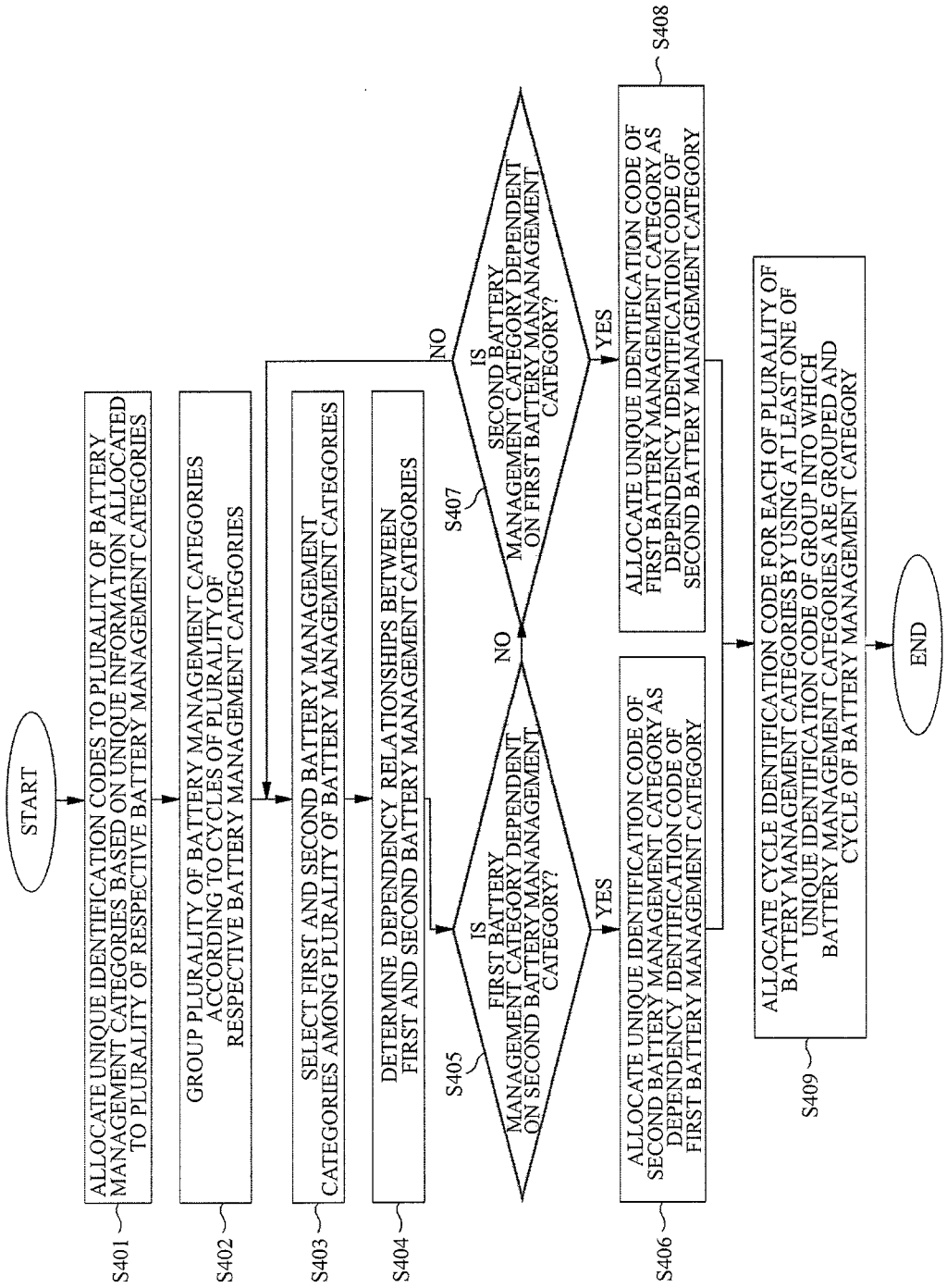

[Figure 5]
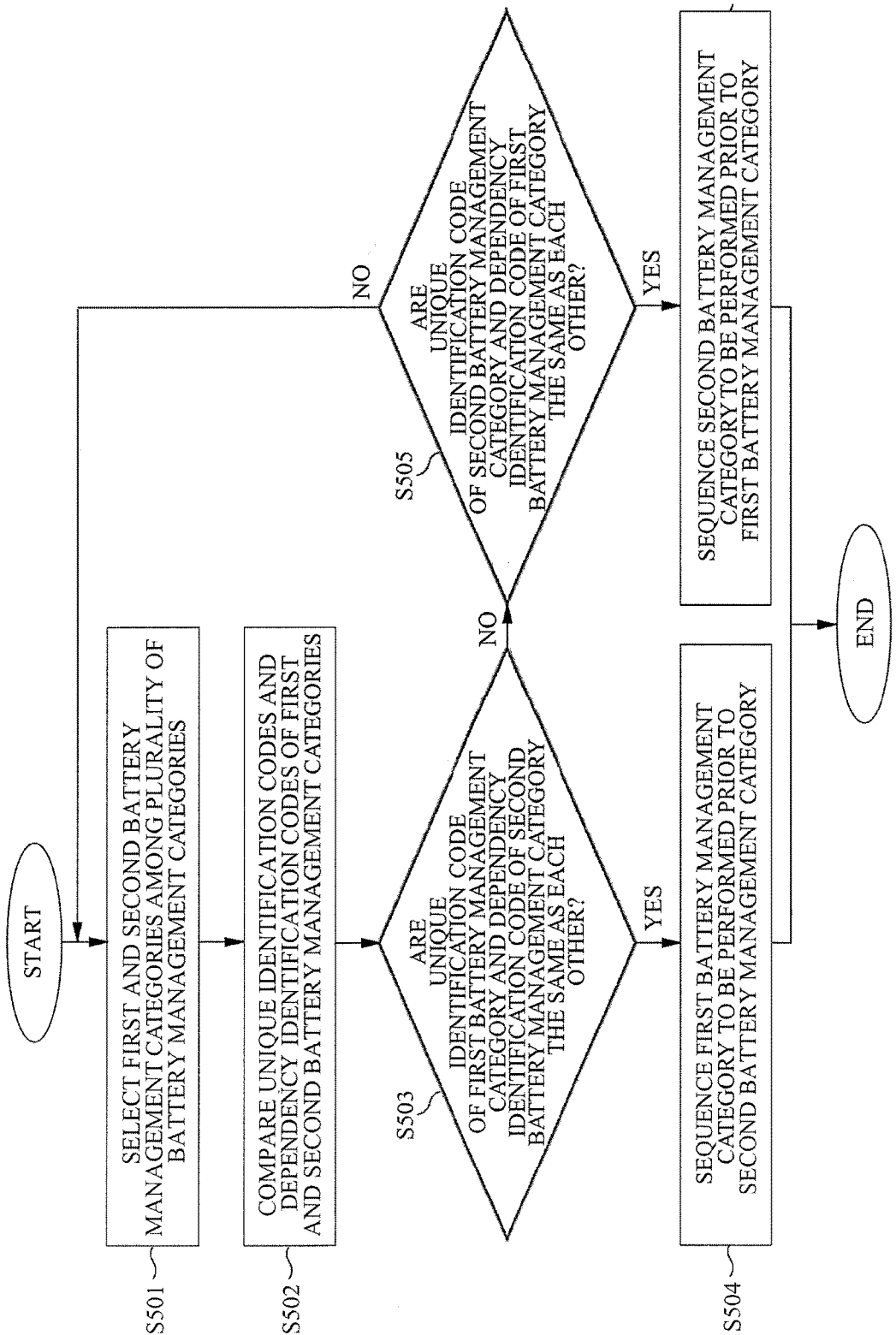

IDENTIFICATION CODE ALLOCATING DEVICE FOR BATTERY MANAGEMENT CATEGORIES, SEQUENCING DEVICE FOR BATTERY MANAGEMENT CATEGORIES, AND BATTERY MANAGEMENT METHOD USING SAME

TECHNICAL FIELD

This application claims priority to and the benefit of Korean Patent Application No. 10-2014-0140557 filed in the Korean Intellectual Property Office on Oct. 17, 2014, the entire contents of which are incorporated herein by reference.

The present invention relates to an identification code allocating device for battery management categories, a sequencing device for the battery management categories, and a battery management method using the same, and more particularly, to an identification code allocating device for battery management categories, a sequencing device for the battery management categories, and a battery management method using the same which allocate a unique identification code for a plurality of battery management categories each for battery management, allocate cycle identification information by using at least one of unique identification information of a group to which the plurality of battery management categories belong to and a cycle of the plurality of battery management categories, and allocate a dependency identification code to correspond to dependency relationships among the plurality of battery management categories. Further, the present invention relates to an identification code allocating device for battery management categories, a sequencing device for the battery management categories, and a battery management method using the same which sequence a performance sequence among the plurality of battery management categories by comparing the dependency identification code allocated to each of the plurality of battery management categories.

BACKGROUND ART

In recent years, due to exhaustion of fossil energy and environmental pollution caused by using the fossil energy, an interest in electric products which can be driven by using a secondary cell battery has increased. As a result, as technological development and the demand of a mobile apparatus, an electric vehicle (EV), a hybrid vehicle (HV), an energy storage system (ESS), and an uninterruptible power supply (UPS) increase, the demand of the secondary cell battery as an energy source has rapidly increased.

The secondary cell battery attracts attention as a new energy source for an environment-friendly purpose and improvement of energy efficiency in that the secondary cell battery has a primary advantage in that the secondary cell battery can remarkably reduce use of the fossil energy and no by-product is produced by use of the energy.

Research and development of a battery has been in active progress due to an increase in demand and usage of the battery and in particular, research and development of a battery management system has been in progress, which measures voltage, current, and a temperature of the battery and diagnoses whether the battery is abnormal based on a measurement result in order to test the performance of the battery or manage the performance of the battery constantly.

However, the battery management system in the related art has a problem in that the battery management system determines a precondition between a step of just measuring the state of the battery and a step of diagnosing whether the battery is abnormal and just sequentially performs the aforementioned steps according to the determined condition, and as a result, a correlation between the respective steps and an execution cycle are not considered.

Therefore, the present inventor has invented an identification code allocating device for battery management categories, a sequencing device for the battery management categories, and a battery management method using the same which allocate a unique identification code for a plurality of battery management categories each for battery management, allocate cycle identification information by using at least one of unique identification information of a group to which the plurality of battery management categories belongs and a cycle of the plurality of battery management categories, allocate a dependency identification code to correspond to dependency relationships among the plurality of battery management categories, and compare the dependency identification codes allocated to for each of the plurality of battery management categories to sequence an execution sequence among the plurality of battery management categories.

DETAILED DESCRIPTION OF THE INVENTION

Technical Problem

The present invention has been made in an effort to provide an identification code allocating device for battery management categories, a sequencing device for the battery management categories, and a battery management method using the same which can define an execution sequence of the battery management category considering a cycle and dependency relationships of the battery management category by sequencing execution of a plurality of battery management categories by comparing dependency identification codes allocated by using at least one of unique identification information of a group to which the plurality of battery management categories belongs and a cycle of the plurality of battery management categories, and dependency relationships among the plurality of battery management categories.

Technical Solution

According to an exemplary embodiment of the present invention, an identification code allocating device for battery management categories is configured to include: a unique identification code allocating unit allocating a unique identification code for a plurality of battery management categories each; a cycle identification code allocating unit allocating a cycle identification code for each of the plurality of battery management categories to correspond to a cycle of each of the plurality of battery management categories; and a dependency identification code allocating unit allocating a dependency identification code for each of the plurality of battery management categories to correspond to dependency relationships among the plurality of battery management categories.

When a second battery management category among the plurality of battery management categories is dependent on a first battery management category, the dependency identification code allocating unit may allocate a unique identification code of the first battery management category as a dependency identification code of the second battery management category.

The plurality of battery management categories may be a battery state measurement item for measuring the state of a battery or a battery state diagnosis item for diagnosing whether the state of the battery is abnormal.

The identification code allocating device for battery management categories may further include a groping unit grouping the plurality of battery management categories according to the cycle of the plurality of battery management categories.

The grouping unit may group the battery state measurement item and the battery state diagnosis item into different groups.

The cycle identification code allocating unit may allocate the cycle identification code for each of the plurality of battery management categories by using at least one of the unique identification code of the group into which the battery management category is group and the cycle of the battery management category.

According to another exemplary embodiment of the present invention, a sequencing device for battery management categories is configured to include: a unique identification code allocating unit allocating a unique identification code for a plurality of battery management categories each; a cycle identification code allocating unit allocating a cycle identification code for each of the plurality of battery management categories to correspond to a cycle of each the plurality of battery management categories; a dependency identification code allocating unit allocating a dependency identification code for each of the plurality of battery management categories to correspond to dependency relationships among the plurality of battery management categories; and a setting unit sequencing execution of the plurality of battery management categories by comparing the unique identification code and the dependency identification code.

When a second battery management category among the plurality of battery management categories is dependent on a first battery management category, the dependency identification code allocating unit may allocate a unique identification code of the first battery management category as a dependency identification code of the second battery management category.

The setting unit may compare a unique identification code of a first battery management category and a dependency identification code of a second battery management category among the plurality of battery management categories and sequence the first battery management category to be performed prior to the second battery management category when comparison result values are the same as each other.

When the comparison result values acquired by comparing of the unique identification code of the first battery management category and the dependency identification code of the second battery management category are not the same as each other and when comparison result values acquired by comparing the unique identification code of the second battery management category and the dependency identification code of the first battery management category, the setting unit may sequence the second battery management category to be performed prior to the first battery management category.

The plurality of battery management categories may be a battery state measurement item for measuring the state of a battery or a battery state diagnosis item for diagnosing whether the state of the battery is abnormal.

The sequencing device for battery management categories may further include a groping unit grouping the plurality of battery management categories according to the cycle of the plurality of battery management categories.

The grouping unit may group the battery state measurement item and the battery state diagnosis item into different groups.

The cycle identification code allocating unit may allocate the cycle identification code for each of the plurality of battery management categories by using at least one of the unique identification code of the group into which the battery management category is group and the cycle of the battery management category.

According to an exemplary embodiment of the present invention, a battery management method is configured to include: allocating, by a unique identification code allocating unit, a unique identification code for a plurality of battery management categories each; allocating, by a cycle identification code allocating unit, a cycle identification code for each of the plurality of battery management categories to correspond to a cycle of each of the plurality of battery management categories; and allocating, by a dependency identification code allocating unit, a dependency identification code for each of the plurality of battery management categories to correspond to dependency relationships among the plurality of battery management categories.

The allocating of the dependency identification code may include allocating, by the dependency identification code allocating unit, when a second battery management category among the plurality of battery management categories is dependent on a first battery management category, a unique identification code of the first battery management category as a dependency identification code of the second battery management category.

The plurality of battery management categories may be a battery state measurement item for measuring the state of a battery or a battery state diagnosis item for diagnosing whether the state of the battery is abnormal.

The battery management method may further include grouping, by a grouping unit, the plurality of battery management categories according to the cycle of the plurality of battery management categories.

The grouping may include grouping, by the grouping unit, the battery state measurement item and the battery state diagnosis item into different groups.

The allocating of the cycle identification code may include allocating, by the cycle identification code allocating unit, the cycle identification code for each of the plurality of battery management categories by using at least one of the unique identification code of the group into which the battery management category is group and the cycle of the battery management category.

The battery management method may further include sequencing, by a setting unit, execution of the plurality of battery management categories by comparing the unique identification code and the dependency identification code.

The sequencing may include comparing, by the setting unit, a unique identification code of a first battery management category and a dependency identification code of a second battery management category among the plurality of battery management categories and sequences the first battery management category to be performed prior to the second battery management category when comparison result values are the same as each other.

The sequencing further may include sequencing, by the setting unit, when the comparison result values acquired by comparing of the unique identification code of the first battery management category and the dependency identification code of the second battery management category are not the same as each other and when comparison result values acquired by comparing the unique identification code of the second battery management category and the dependency identification code of the first battery management category, the second battery management category to be performed prior to the first battery management category.

Advantageous Effects

According to exemplary embodiments of the present invention, an identification code allocating device for battery management categories, a sequencing device for the battery management categories, and a battery management method using the same sequence battery management categories by considering a cycle and dependency relationships of the battery management categories to improve reliability and effectiveness of measurement and diagnosis results of a battery state.

BRIEF DESCRIPTION OF DRAWINGS

FIG. 1 is a block diagram illustrating a configuration of an identification code allocating device for battery management categories according to an exemplary embodiment of the present invention.

FIG. 2 is a block diagram illustrating a configuration of a sequencing device for battery management categories according to another exemplary embodiment of the present invention.

FIG. 3 is a diagram illustrating one example of a plurality of battery management categories which is grouped.

FIG. 4 is a flowchart illustrating a sequence in which an identification code allocating device for battery management categories allocates identification codes to a plurality of battery management categories according to an exemplary embodiment of the present invention.

FIG. 5 is a flowchart illustrating a sequence in which a sequencing device for battery management categories according to another exemplary embodiment of the present invention sequences a plurality of battery management categories.

BEST MODE

The present invention will be described below in detail with reference to the accompanying drawings. Herein, a detailed description of a known function and a know constitution which may obscure the spirit of the present invention will be skipped. The exemplary embodiments are provided to more completely describe the present invention to those skilled in the art. Accordingly, the shape, the size, etc., of elements in the figures may be exaggerated for explicit comprehension.

In the specification, unless explicitly described to the contrary, the word "comprise" and variations such as "comprises" or "comprising", will be understood to imply the inclusion of stated elements but not the exclusion of any other elements.

Further, terms including "unit" disclosed in the specification mean a unit that processes at least one function or operation and this may be implemented by hardware or software or a combination of hardware and software.

FIG. 1 is a block diagram illustrating a configuration of an identification code allocating device for battery management categories according to an exemplary embodiment of the present invention. FIG. 3 is a diagram illustrating one example of a plurality of battery management categories which is grouped.

Referring to FIG. 1, the identification code allocating device 100 for battery management categories may be configured to include a unique identification code allocating unit 110, a grouping unit 120, a cycle identification code allocating unit 130, and a dependency identification code 140. The identification code allocating device 100 of the battery management category illustrated in FIG. 1 follows an exemplary embodiment and components thereof are not limited to the exemplary embodiment illustrated in FIG. 1 and may be added, changed, or deleted as necessary.

The unique identification code allocating unit 110 may serve to allocate unique identification codes to a plurality of battery management categories based on unique information allocated to each of the plurality of battery management categories. In this case, the unique identification codes may be allocated to have the number of bits which is smaller than the number of bits unique information allocated to each of the plurality of battery management categories.

Herein, the unique information allocated to each of the plurality of battery management categories may vary according to the type or cycle of the battery management category and the type of battery management category may be a battery state measurement item or a battery state diagnosis item.

The battery state measurement item may be battery management categories for measuring physical quantities including voltage, current, and a temperature from a battery and a circuit connected with the battery. For example, the battery state measurement item may be an analog-digital converter (ADC) reference voltage measurement item, a battery module temperature measurement item, and a battery cell voltage measurement item.

The battery state diagnosis item may be a battery management category for diagnosing the state of the battery based on data measured from the battery state measurement item. For example, the battery state diagnosis item may be a battery cell balancing circuit diagnosis item, a battery cell voltage deviation diagnosis item, a battery state of charge (SOC) diagnosis item, a battery module temperature deviation diagnosis item, and a temperature sensor diagnosis item.

The cycle of the battery management category as a cycle at which the battery management category is performed may vary according to the type of the battery management category and the cycle of the battery state diagnosis item may be longer than the cycle of the battery state measurement item due to a characteristic of the battery state measurement item for measuring the voltage, current, and temperature of the battery and the circuit connected with the battery in real time and a characteristic of the battery state diagnosis item for diagnosing the state of the battery based on the data measured from the battery state measurement item.

The grouping unit 120 may serve to group the plurality of battery management categories according to the cycle of each of the plurality of battery management categories. Further, the grouping unit 120 may group different types of battery management categories into different groups.

In more detail, the grouping unit 120 may group battery management categories having the same type and cycle of the battery management category among the plurality of battery management categories and allocate the unique identification code of the group based on the type or cycle of the grouped battery management category.

A process in which the grouping unit 120 groups the plurality of battery management categories will be described through FIG. 3.

Referring to FIG. 3, the grouping unit 120 may group an application specific integrated circuit (ASIC) ADC reference voltage measurement item 301, an AUX voltage measurement item 302, and a micro controller unit (MCU) ADC reference voltage measurement item 303 in which the type and cycle of the battery management category are the same as the battery state measurement item and 100 ms into an L1 group and allocate the unique identification code of the group to "1" based on the cycles of the grouped battery management categories. Further, the grouping unit 120 may additionally allocate "1" to the unique identification code of the group based on a group name L1.

Similarly to the process of grouping the L1 group, the grouping unit 120 may group a battery cell voltage measurement item 304 and a battery module temperature measurement item 305 in which the type and cycle of the battery management category are the same as the battery state measurement item and 200 ms into an L2 group and allocate the unique identification code of the group as "2, 2".

Subsequently, the grouping unit 120 may group into an L3 group a busbar connectivity diagnosis item 306, a battery cell voltage deviation diagnosis item 307, and a battery cell balancing circuit diagnosis item 308 in which the type and cycle of the battery management category are the same as the battery state diagnosis item and 400 ms and allocate the unique identification code of the group as "3, 4" and since a battery SOC diagnosis item 309, a battery cell output deterioration diagnosis item 310, a battery module temperature deviation diagnosis item 311, and a temperature sensor diagnosis item 312 also have the same type and cycle of the battery management category as the battery state diagnosis item and 1000 ms, the grouping unit 120 may group the items into an L4 group and thereafter, allocate the unique identification code of the group as "4, 10".

Referring to FIG. 1, the cycle identification code allocating unit 130 will be described.

The cycle identification code allocating unit 130 may serve to allocate the cycle identification code for each of the plurality of battery management categories by using at least one of the unique identification code of the group into which the battery management categories are grouped and the cycle of the battery management categories.

In more detail, the cycle identification code allocating unit 130 may allocate the cycle identification code of the battery management category by using information on the cycle of the unique identification code of the battery management category or the unique identification code of the group to which the battery management category belongs.

For example, when the cycle of the battery management category is 1000 ms and the unique identification code of the L4 group to which the corresponding battery management category belongs is "4, 10", the cycle identification code allocating unit 130 may allocate the cycle identification code of the battery management category as "10" by using "4, 10" as the unique identification code of the group.

Further, the cycle identification code allocating unit 130 may table and store the unique identification codes of the groups to which the plurality of battery management categories belong.

For example, the unique identification codes of the groups L1, L2, L3, and L4 are allocated as "1, 1", "2, 2", "3, 4", and "4, 10", the unique identification code of each group may be tabled and stored like a matrix given below.

[1, 1] [2, 2] [3, 4] [4, 10]

The dependency identification code allocating unit 140 may serve to allocate the dependency identification code for each of the plurality of battery management categories to correspond to the dependency relationships among the plurality of battery management categories.

In more detail, the dependency identification code allocating unit 140 may select two battery management categories among the plurality of battery management categories as first and second battery management categories, respectively, and determine the dependency relationships between the selected first and second battery management categories. Herein, the dependency relationships may mean a relationship in which when any one battery management category of two battery management categories is preceded, the other one battery management category may be performed. For example, the battery temperature deviation diagnosis item 311 as a battery management category which may be performed only when the battery module temperature measurement item 305 is preceded may have dependency relationships in which the battery temperature deviation diagnosis item 311 is dependent on the battery module temperature measurement item 305.

Subsequently, as a result of determining the dependency relationships between the selected first and second battery management categories among the plurality of battery management categories, the dependency identification code allocating unit 140 may allocate a unique identification code of the first battery management category as a dependency identification code of a second battery management category when the second battery management category is dependent on the first battery management category and contrary to this, when the first battery management category is dependent on the second battery management category, the dependency identification code allocating unit 140 may allocate a unique identification code of the second battery management category as a dependency identification code of the first battery management category.

Further, the dependency identification code allocating unit 140 selects the new first and second battery management categories among the plurality of battery management categories to repeat the abovementioned process when the first and second battery management categories are not dependent on each other. Therefore, the dependency identification code allocating unit 140 may allocate the dependency identification code by determining the dependency relationships among all of the plurality of battery management categories.

For example, when the unique identification codes of the battery module temperature measurement item 305 and the battery temperature deviation diagnosis item 311 are "305" and "3111", respectively, and the battery temperature deviation diagnosis item 311 is dependent on the battery module temperature measurement item 305, the dependency identification code allocating unit 140 may allocate the unique identification code "305" of the battery module temperature measurement item 305 as the dependency identification code of the battery temperature deviation diagnosis item 311.

Next, a sequencing device 100' for battery management categories according to an exemplary embodiment of the present invention will be described with reference to FIGS. 2 and 3.

FIG. 2 is a block diagram illustrating a configuration of a sequencing device for battery management categories according to another exemplary embodiment of the present invention. FIG. 3 is a diagram illustrating one example of a plurality of battery management categories which is grouped.

Referring to FIG. 2, the sequencing device 100' of the battery management categories may be configured to include a unique identification code allocating unit 110, a grouping unit 120, a cycle identification code allocating unit 130, a dependency identification code 140, and a setting unit 150. The battery management category sequencing device 100' illustrated in FIG. 2 follows another exemplary embodiment and components thereof are limited to the exemplary embodiment illustrated in FIG. 2 and may be added, changed, or deleted as necessary.

When the identification code allocating device 100 of the battery management category according to the exemplary embodiment of the present invention is compared with the battery management category sequencing device 100' according to another exemplary embodiment of the present invention, since the unique identification code allocating unit 110, the grouping unit 120, the cycle identification code allocating unit 130, and the dependency identification code 140 have the same configuration and perform the same role, a description thereof will be omitted.

The setting unit 150 may serve sequence execution of the plurality of battery management categories by comparing the unique identification codes and the dependency identification codes of the plurality of battery management categories.

In more detail, the setting unit 150 compares the unique identification code of the first battery management category and the dependency identification code of the second battery management category by selecting two battery management categories among the plurality of battery management categories as the first and second battery management categories, respectively, and sequence the first battery management category to be performed prior to the second battery management category when comparison result values are the same as each other.

When the comparison result values of the unique identification code of the first battery management category and the dependency identification code of the second battery management category are not the same as each other, the setting unit 150 may compare the unique identification code of the second battery management category and the dependency identification code of the first battery management category and when the comparison result values are the same as each other, the setting unit 150 may sequence the second battery management category to be performed prior to the first battery management category.

Further, when the unique identification code of the first battery management category and the dependency identification code of the second battery management category are not the same as each other and the unique identification code of the second battery management category and the dependency identification code of the first battery management category are also not the same as each other, the setting unit 150 selects the new first and second battery management categories among the plurality of battery management categories without sequencing the execution of the first and second battery management categories to repeat the aforementioned process. Therefore, the setting unit 150 may sequence execution of battery management categories that has a sequence relationship of an execution sequence among the plurality of battery management categories.

For example, when the unique identification codes of the battery module temperature measurement item 305 and the battery temperature deviation diagnosis item 311 are "305" and "311", respectively, and the dependency identification codes of the battery module temperature measurement item 305 and the battery temperature deviation diagnosis item 311 are "303" and "305", respectively, the setting unit 150 may sequence the battery module temperature measurement item 305 to be performed prior to the battery temperature deviation diagnosis item 311.

FIG. 4 is a flowchart illustrating a sequence in which an identification code allocating device for battery management categories allocates identification codes to a plurality of battery management categories according to an exemplary embodiment of the present invention.

Referring to FIG. 4, the unique identification code allocating unit allocates unique identification codes to a plurality of battery management categories based on unique information allocated to each the plurality of battery management categories (S410).

Herein, the unique information allocated to each of the plurality of battery management categories may be the type or cycle of the battery management category.

Subsequently, the grouping unit groups the plurality of battery management categories according to the cycle of each of the plurality of battery management categories (S402).

In more detail, the grouping unit groups battery management categories having the same type and cycle of the battery management category among the plurality of battery management categories and allocates the unique identification code of the group based on the type or cycle of the grouped battery management category.

Thereafter, the dependency identification code allocating unit selects two battery management categories among the plurality of battery management categories as first and second battery management categories, respectively (S403) and determines the dependency relationships between the first and second battery management categories (S404).

When the first battery management category is dependent on the second battery management category (S405), the dependency identification code allocating unit allocates the unique identification code of the second battery management category as the dependency identification code of the first battery management category (S406).

Contrary to this, when the first battery management category is not dependent on the second battery management category (S405) and the second battery management category is dependent on the first battery management category (S407), the dependency identification code allocating unit allocates the unique identification code of the first battery management category as the dependency identification code of the second battery management category (S408).

Meanwhile, when the first and second battery management categories do not have the dependency relationships (S407), the dependency identification code allocating unit returns to step S403 to select the new first and second battery management categories among the plurality of battery management categories.

Therefore, the dependency identification code allocating unit may allocate the dependency identification code by determining the dependency relationships among all of the plurality of battery management categories.

Next, the cycle identification code allocating unit allocates the cycle identification code for each of the plurality of battery management categories by using at least one of the unique identification code of the group into which the battery management categories are grouped and the cycle of the battery management category (S409).

FIG. 5 is a flowchart illustrating a sequence in which a sequencing device for battery management categories according to another exemplary embodiment of the present invention sequences a plurality of battery management categories.

The sequencing device for the battery management categories according to another exemplary embodiment of the present invention first allocates the identification codes to the plurality of battery management categories and sequences the plurality of battery management categories by using the allocated identification codes. Accordingly, a sequence for allocating the identification codes to the plurality of battery management categories in the sequence in which the sequencing device for the battery management categories according to another exemplary embodiment of the present invention sequences the plurality of battery management categories may be the same as the sequence in which the identification code allocating device of the battery management category according to the exemplary embodiment of the present invention allocates the identification codes to the plurality of battery management categories, a duplicated description therewith will be omitted.

Referring to FIG. 5, the setting unit selects two battery management categories among the plurality of battery management categories as first and second battery management categories, respectively (S501) and compares the unique identification codes and dependency identification codes of the first and second battery management categories (S502).

When the unique identification code of the first battery management category is the same as the dependency identification code of the second battery management category (S503), the setting unit sequences the first battery management category to be performed prior to the second battery management category (S504).

On the contrary, when the unique identification code of the first battery management category and the dependency identification code of the second battery management category are not the same as each other (S503) and the unique identification code of the second battery management category and the dependency identification code of the first battery management category are the same as each other (S505), the setting unit sequences the second battery management category to be performed prior to the first battery management category (S506).

Meanwhile, when the unique identification codes and the dependency identification codes of the first and second battery management categories are not the same as each other (S505), the setting unit returns to step S501 to select the new first and second battery management categories among the plurality of battery management categories.

Therefore, the setting unit may sequence execution of battery management categories that has a sequence relationship of an execution sequence among the plurality of battery management categories.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. An identification code allocating device for battery management categories, the device comprising:
a unique identification code allocating unit allocating a unique identification code for a plurality of battery management categories each, wherein each unique identification code has a smaller number of bits than allocated to the respective battery management category;
a cycle identification code allocating unit allocating a cycle identification code for each of the plurality of battery management categories to correspond to a cycle of each of the plurality of battery management categories;
a dependency identification code allocating unit allocating a dependency identification code for each of the plurality of battery management categories to correspond to dependency relationships among the plurality of battery management categories,
wherein the identification code allocating device is configured to:
define an execution sequence of the battery management categories based on a cycle and the dependency relationships of the battery management categories; and
sequence execution of the plurality of battery management categories by comparing the unique identification code and the dependency identification code,
wherein the battery management categories are separated into first and second groups, the first group being at least one battery state measurement item for measuring physical quantities of the battery and the second group being at least one battery state diagnosis item for diagnosing the state of the battery based on date measured by the battery state measurement item, and
wherein among dependency relationships between one or more of the at least one battery statement measurement item and the at least one battery state diagnosis item, the battery state measurement item is sequenced prior to the battery state diagnosis item.

2. The identification code allocating device for battery management categories of claim 1, wherein when a second battery management category among the plurality of battery management categories is dependent on a first battery management category, the dependency identification code allocating unit allocates a unique identification code of the first battery management category as a dependency identification code of the second battery management category.

3. The identification code allocating device for battery management categories of claim 1, wherein the cycle identification code allocating unit allocates the cycle identification code for each of the plurality of battery management categories by using at least one of the unique identification code of the group into which the battery management category is group and the cycle of the battery management category.

4. The identification code allocating device for battery management categories of claim 1, wherein the at least one battery state measurement item includes a plurality of battery state measurement items that respectively measure one of a voltage, current and temperature.

5. The identification code allocating device for battery management categories of claim 1, wherein the at least one battery state diagnosis item includes a battery cell balancing circuit diagnosis item, a battery cell voltage deviation diagnosis item, a battery state of charge (SOC) diagnosis item, a battery module temperature deviation diagnosis item, and a temperature sensor diagnosis item.

6. A sequencing device for battery management categories, the device comprising:
a unique identification code allocating unit allocating a unique identification code for a plurality of battery management categories each, wherein each unique identification code has a smaller number of bits than allocated to the respective battery management category;
a cycle identification code allocating unit allocating a cycle identification code for each of the plurality of battery management categories to correspond to a cycle of each the plurality of battery management categories;
a dependency identification code allocating unit allocating a dependency identification code for each of the plurality of battery management categories to correspond to dependency relationships among the plurality of battery management categories, wherein an execution sequence of the battery management categories is defined based on a cycle and the dependency relationships of the battery management categories; and
a setting unit sequencing execution of the plurality of battery management categories by comparing the unique identification code and the dependency identification code,
wherein the battery management categories are separated into first and second groups, the first group being at least one battery state measurement item for measuring physical quantities of the battery and the second group being at least one battery state diagnosis item for diagnosing the state of the battery based on date measured by the battery state measurement item, and
wherein among dependency relationships between one or more of the at least one battery statement measurement item and the at least one battery state diagnosis item, the battery state measurement item is sequenced prior to the battery state diagnosis item.

7. The sequencing device for battery management categories of claim 6, wherein when a second battery management category among the plurality of battery management categories is dependent on a first battery management category, the dependency identification code allocating unit allocates a unique identification code of the first battery management category as a dependency identification code of the second battery management category.

8. The sequencing device for battery management categories of claim 6, wherein the setting unit compares a unique identification code of a first battery management category and a dependency identification code of a second battery management category among the plurality of battery management categories and sequences the first battery management category to be performed prior to the second battery management category when comparison result values are the same as each other.

9. The sequencing device for battery management categories of claim 8, wherein when the comparison result values acquired by comparing of the unique identification code of the first battery management category and the dependency identification code of the second battery management category are not the same as each other and when comparison result values acquired by comparing the unique identification code of the second battery management category and the dependency identification code of the first battery management category, the setting unit sequences the second battery management category to be performed prior to the first battery management category.

10. The sequencing device for battery management categories of claim 6, wherein the at least one battery state measurement item includes a plurality of battery state measurement items that respectively measure one of a voltage, current and temperature.

11. The sequencing device for battery management categories of claim 6, wherein the at least one battery state diagnosis item includes a battery cell balancing circuit diagnosis item, a battery cell voltage deviation diagnosis item, a battery state of charge (SOC) diagnosis item, a battery module temperature deviation diagnosis item, and a temperature sensor diagnosis item.

12. A battery management method comprising:
allocating, by a unique identification code allocating unit, a unique identification code for a plurality of battery management categories each, wherein each unique identification code has a smaller number of bits than allocated to the respective battery management category;
allocating, by a cycle identification code allocating unit, a cycle identification code for each of the plurality of battery management categories to correspond to a cycle of each of the plurality of battery management categories;
allocating, by a dependency identification code allocating unit, a dependency identification code for each of the plurality of battery management categories to correspond to dependency relationships among the plurality of battery management categories;
defining an execution sequence of the battery management categories based on a cycle and the dependency relationships of the battery management categories; and
sequencing, by a setting unit, execution of the plurality of battery management categories by comparing the unique identification code and the dependency identification code,
wherein the battery management categories are separated into first and second groups, the first group being at least one battery state measurement item for measuring physical quantities of the battery and the second group being at least one battery state diagnosis item for diagnosing the state of the battery based on date measured by the battery state measurement item, and
wherein among dependency relationships between one or more of the at least one battery statement measurement item and the at least one battery state diagnosis item, the battery state measurement item is sequenced prior to the battery state diagnosis item.

13. The battery management method of claim 12, wherein the allocating of the dependency identification code includes allocating, by the dependency identification code allocating unit, when a second battery management category among the plurality of battery management categories is dependent on a first battery management category, a unique identification code of the first battery management category as a dependency identification code of the second battery management category.

14. The battery management method of claim 12, wherein the allocating of the cycle identification code includes allocating, by the cycle identification code allocating unit, the cycle identification code for each of the plurality of battery management categories by using at least one of the unique identification code of the group into which the battery management category is group and the cycle of the battery management category.

15. The battery management method of claim 12, wherein the sequencing includes comparing, by the setting unit, a unique identification code of a first battery management category and a dependency identification code of a second battery management category among the plurality of battery management categories and sequences the first battery management category to be performed prior to the second battery management category when comparison result values are the same as each other.

16. The battery management method of claim 15, wherein the sequencing further includes sequencing, by the setting unit, when the comparison result values acquired by comparing of the unique identification code of the first battery management category and the dependency identification code of the second battery management category are not the same as each other and when comparison result values acquired by comparing the unique identification code of the second battery management category and the dependency identification code of the first battery management category, the second battery management category to be performed prior to the first battery management category.

17. The battery management method of claim 12, wherein the at least one battery state measurement item includes a plurality of battery state measurement items that respectively measure one of a voltage, current and temperature.

18. The battery management method of claim 12, wherein the at least one battery state diagnosis item includes a battery cell balancing circuit diagnosis item, a battery cell voltage deviation diagnosis item, a battery state of charge (SOC) diagnosis item, a battery module temperature deviation diagnosis item, and a temperature sensor diagnosis item.

* * * * *